United States Patent
Bettinelli et al.

(10) Patent No.: US 8,802,487 B2
(45) Date of Patent: Aug. 12, 2014

(54) SILK-SCREEN STENCIL FOR PRINTING ONTO A PHOTOVOLTAIC CELL

(75) Inventors: Armand Bettinelli, Coublevie (FR); Frédéric Barbier, Saint Martin d'Heres (FR)

(73) Assignee: Commissariat a l'energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/008,663

(22) PCT Filed: Feb. 3, 2012

(86) PCT No.: PCT/EP2012/051817
§ 371 (c)(1),
(2), (4) Date: Jan. 15, 2014

(87) PCT Pub. No.: WO2012/130508
PCT Pub. Date: Oct. 4, 2012

(65) Prior Publication Data
US 2014/0127854 A1 May 8, 2014

(30) Foreign Application Priority Data
Mar. 29, 2011 (FR) ...................................... 11 52581

(51) Int. Cl.
*H01L 21/3205* (2006.01)
*B41F 15/00* (2006.01)

(52) U.S. Cl.
USPC .............. 438/98; 438/674; 101/127; 101/129

(58) Field of Classification Search
USPC .............................. 101/127, 129; 438/98, 674
See application file for complete search history.

(56) References Cited

U.S. PATENT DOCUMENTS

| | | | | |
|---|---|---|---|---|
| 5,979,312 A | * | 11/1999 | Williams | ...................... 101/127 |
| 7,513,194 B2 | * | 4/2009 | Yanagihara et al. | ........ 101/127.1 |
| 2002/0148370 A1 | * | 10/2002 | Erdmann | .................... 101/127.1 |
| 2008/0289519 A1 | * | 11/2008 | Newman, Jr. | ............... 101/127.1 |
| 2010/0252102 A1 | * | 10/2010 | Bettinelli | ....................... 136/256 |
| 2010/0258014 A1 | * | 10/2010 | van Heijningen | ........... 101/128.4 |
| 2013/0265642 A1 | * | 10/2013 | Vasylyev | ....................... 359/595 |
| 2014/0057369 A1 | * | 2/2014 | Lee et al. | ............................ 438/3 |
| 2014/0076231 A1 | * | 3/2014 | Hrabi et al. | .................... 118/504 |

FOREIGN PATENT DOCUMENTS

| | | |
|---|---|---|
| EP | 0729189 A | 8/1996 |
| FR | 2 943 947 A | 10/2010 |
| GB | 2 2644 460 A | 9/1993 |
| GB | 2 364 961 A | 2/2002 |
| GB | 2 385 827 A | 9/2003 |

* cited by examiner

*Primary Examiner* — Alexander Ghyka
(74) *Attorney, Agent, or Firm* — Frommer Lawrence & Haug LLP; Ronald R Santucci

(57) ABSTRACT

Stencil for a screen-printing system, comprising slits (22, 23) in a central printing zone (13), forming a pattern to be printed, characterized in that it comprises one or more apertures (32) in a peripheral deforming zone (14), which apertures are intended to cause this peripheral deforming zone (14) to deform under the effect of a stress applied to the stencil while reducing deformation of the central printing one (13).

19 Claims, 7 Drawing Sheets

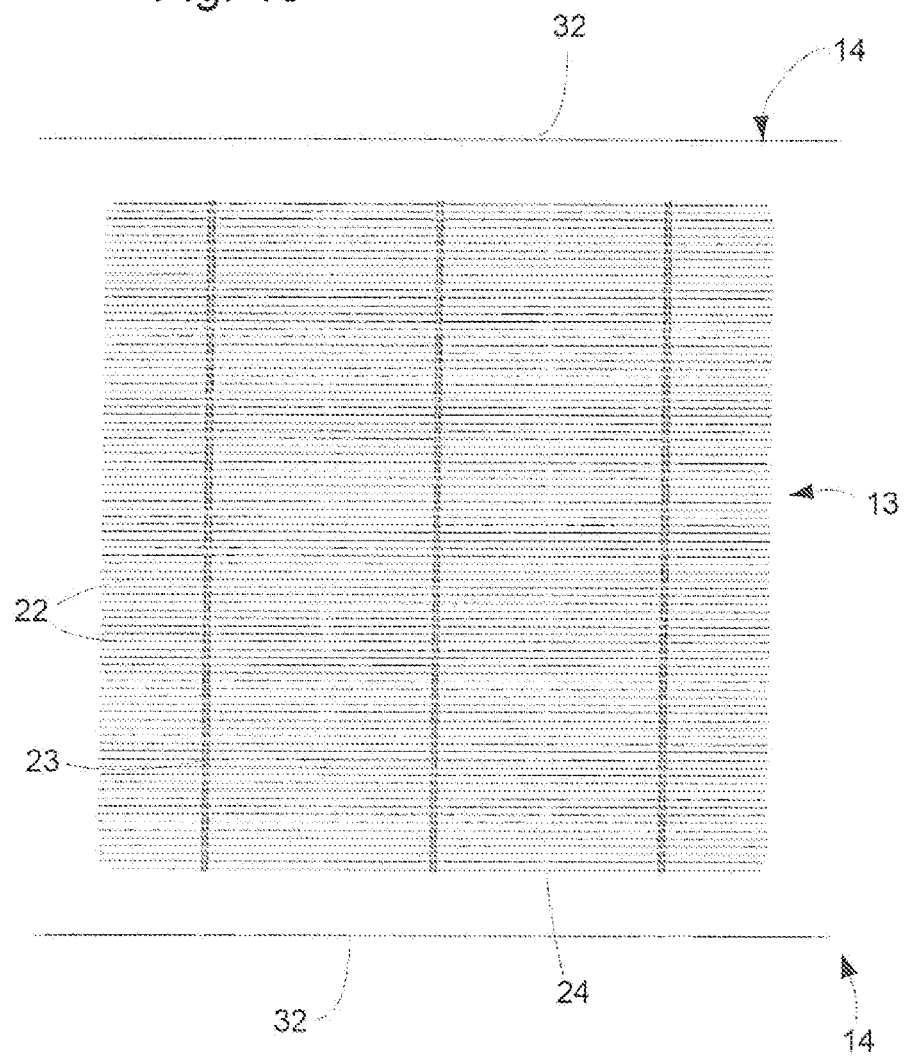

SILK-SCREEN STENCIL FOR PRINTING ONTO A PHOTOVOLTAIC CELL

This application is a 371 of PCT/EP2012/051817 filed on Feb. 3, 2012, published on Oct. 4, 2012 under publication number WO 2012/130508, which claims priority benefits from French Patent Application Number 1152581 filed Mar. 29, 2011, the disclosure of which is incorporated herein by reference.

The invention relates to a stencil for a screen-printing system, and to a printing system per se comprising such a stencil. The invention is particularly suitable for manufacturing photovoltaic devices, particularly for printing collecting conductors on a photovoltaic cell. It also relates to a printing process using such a stencil and to a process for manufacturing a photovoltaic cell incorporating such a printing process. The invention also relates to a unit for producing photovoltaic cells implementing such a process.

A photovoltaic cell is manufactured using a wafer made of a semiconductor, generally silicon. This manufacture in particular requires electrical conductors to be formed on the surface of this wafer. FIG. 1 illustrates the surface of such a wafer 1 according to the prior art, which comprises first parallel conductors of thin width, called collecting conductors 2, the function of which is to collect the electrons created in the silicon by light. In addition, the surface of the wafer 1 comprises other wider parallel conductors 3, sometimes called "bus bars", oriented in a direction perpendicular to the collecting conductors 2, the function of which bus bars is to carry larger currents from photovoltaic cell to photovoltaic cell. These wider conductors 3 are in general connected to a metal strip that extends over their entire length. All of these conductors 2, 3 are obtained by different techniques allowing continuous conductive lines to be formed, which lines extend continuously across the entire length and width of the wafer.

To produce these conductors, one prior-art method consists, for example, in screen-printing a conductive ink on the wafer, in one or two screen-printing steps. To do this, the method consists in making the conductive ink pass through a screen formed from a cloth or fabric. This cloth is covered with a sealing layer except in the locations where the ink must pass through it. The ink is pressed through the cloth using a doctor blade: however, the threads of the cloth hinder this operation, and the resulting conductors never have an ideal geometry, especially as regards the uniformity of the height of the layer of ink deposited: this method does not allow conductors with a sufficiently satisfactory performance to be formed. Specifically, the electrical performance of these conductors is very sensitive to their geometry, and especially to their thickness/width ratio, thickness being measured in the vertical direction perpendicular to the wafer 1, and width being measured in the horizontal direction, transverse to the conductor.

To overcome these drawbacks, a second prior-art method consists in replacing the above cloth with a metal stencil containing through-apertures. However, in order not to weaken these metal masks, and to obtain optimal behaviour during printing, the area of the apertures, and especially of any apertures that extend over the entire length or width of the stencil, must be limited, and the process generally requires at least two printed layers to be superposed, using two separate complementary masks, if the various conductors illustrated in FIG. 1 are to be obtained. For this reason, this process remains complex and expensive. In addition, as the metal stencil does not have the elasticity of a cloth and does not deform sufficiently under the effect of a doctor blade, it is associated with a cloth adhesively bonded to its periphery in order to provide the assembly with sufficient elasticity, this construction being called a "trampoline" assembly. However, this second method has the following drawbacks:

the cloth exerts a stress on the metal stencil which causes it to deform around its apertures, especially those located on the edges. This results in the features printed being larger than desired, leading to aspect defects and thereby decreasing the performance of the photovoltaic cell; and in addition, this stress exerted on the cloth may even induce a more substantial overall deformation of the metal stencil, which is in general very thin, for example bending lines that are intended to be rectilinear. The original conductors are therefore deformed. In addition, it is very difficult to precisely superpose the second layer of conductive ink on the first, thereby degrading the performance of the photovoltaic cell.

Document EP 0 729 189 illustrates, by way of example, a particular approach to this second method.

Thus, a general objective of the invention is to provide a solution for producing an electrical conductor on a wafer of a photovoltaic device, which solution reduces the drawbacks of prior-art solutions.

More precisely, the invention seeks to achieve all or some of the following objectives:

A first objective of the invention is to provide a solution for producing an electrical conductor on a photovoltaic cell allowing the performance of the resulting photovoltaic cell to be optimized.

A second objective of the invention is to provide a solution for producing an electrical conductor on a photovoltaic cell, via a process that is effective and economical and has a high productivity.

For this purpose, the invention relates to a stencil for a screen-printing system, comprising slits in a central printing zone, forming a pattern to be printed, characterized in that it comprises one or more apertures in a peripheral deforming zone, which apertures are intended to cause this peripheral deforming zone to deform under the effect of a stress applied to the stench while reducing deformation of the central printing zone.

The stencil may comprise at least one rectilinear, slit-shaped aperture in a peripheral deforming zone lying substantially parallel to the slits in the central printing zone.

The apertures in the peripheral deforming zone may have an area leading the peripheral deforming zone to have a greater tendency to deform than the central printing zone.

The apertures in the peripheral deforming zone may comprise at least one continuous or discontinuous rectilinear aperture interrupted by bridges of material.

The invention is more precisely defined by the claims.

These objectives, features and advantages of the present invention will be discussed in detail in the following description of particular non-limiting embodiments given with regard to the appended figures, in which:

FIG. 1 schematically illustrates the conductors on the surface of a photovoltaic cell according to the prior art.

FIG. 2 schematically shows a screen-printing system for printing conductors on the surface of a photovoltaic cell, according to the invention.

FIG. 13 shows a top view of a stencil according to a sixth embodiment of the invention.

Figure 2:
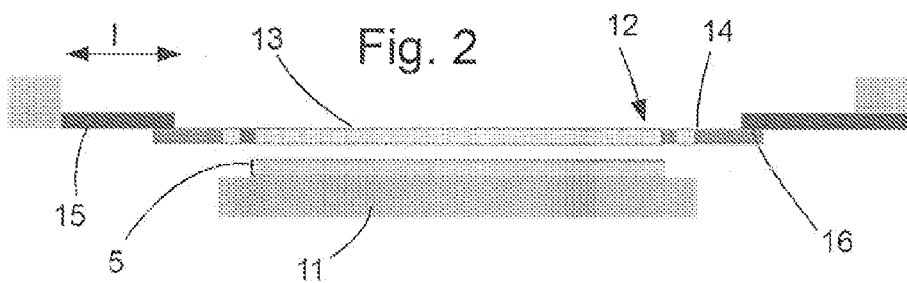

FIG. 2 shows the principal of an embodiment of the invention, applied to a step for screen printing conductors on the surface of a silicon wafer 5 in order to form photovoltaic cells. The printing system comprises a printing table 11 on which the silicon wafer 5 rests, a metal stencil 12 comprising a central printing zone 13, and a peripheral deforming zone 14. This metal stencil 12 is associated with a cloth 15 fastened by any fastening device 16 to its periphery, according to the aforementioned trampoline construction.

Figure 1:
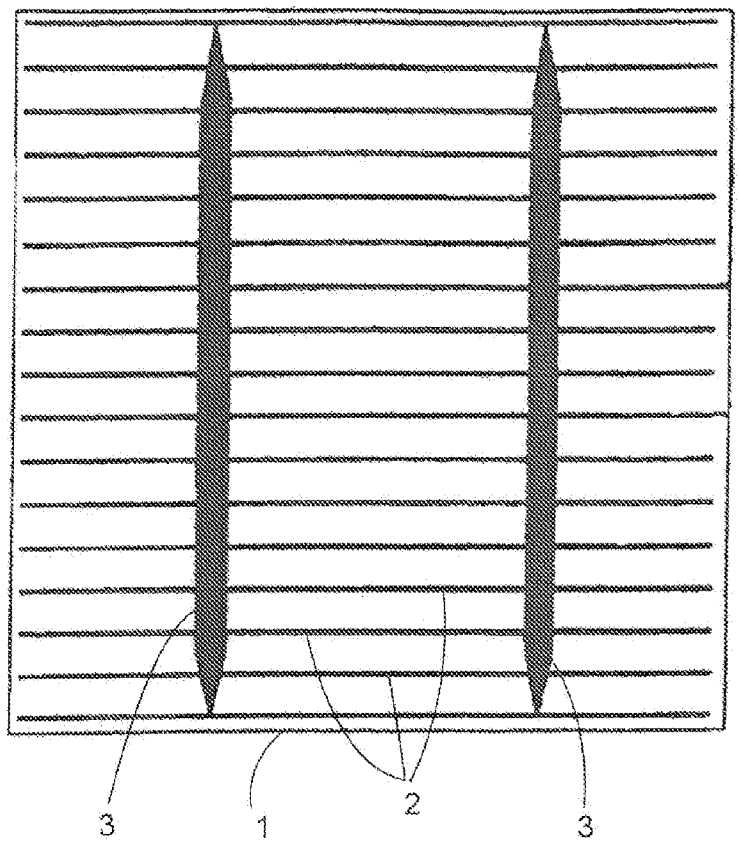

The central printing zone 13 of the metal stencil 12 comprises apertures through which the conductive ink is intended to pass in order to form conductors on the surface of the silicon wafer 5, in order to form various conductors of the future photovoltaic cells, as was explained above and is shown in FIG. 1. Furthermore, the stencil 12 comprises a peripheral deforming zone 14 that intentionally and preferably deforms under the effect of the stress induced by the doctor blade and the hold of the cloth 15 during printing, attenuating or even completely suppressing deformation of the central printing zone 13 of the stencil, especially its lateral part, thus avoiding avoiding the drawbacks of the prior art.

FIGS. 3 to 12 show particular example stencils for a printing system according to various embodiments of the invention.

Figure 3:
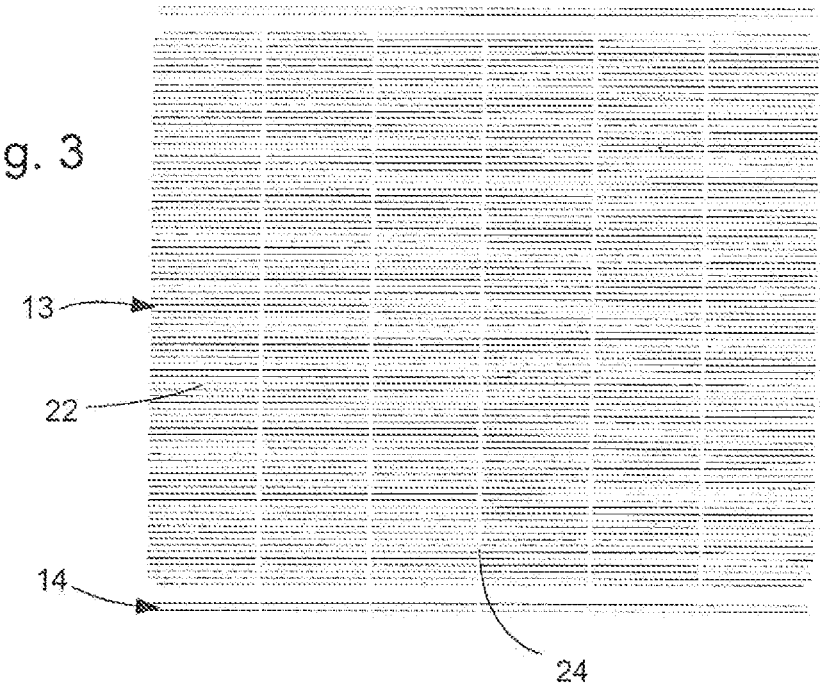
FIG. 3 shows a top view of a stencil according to a first embodiment of the invention.
Figure 4:
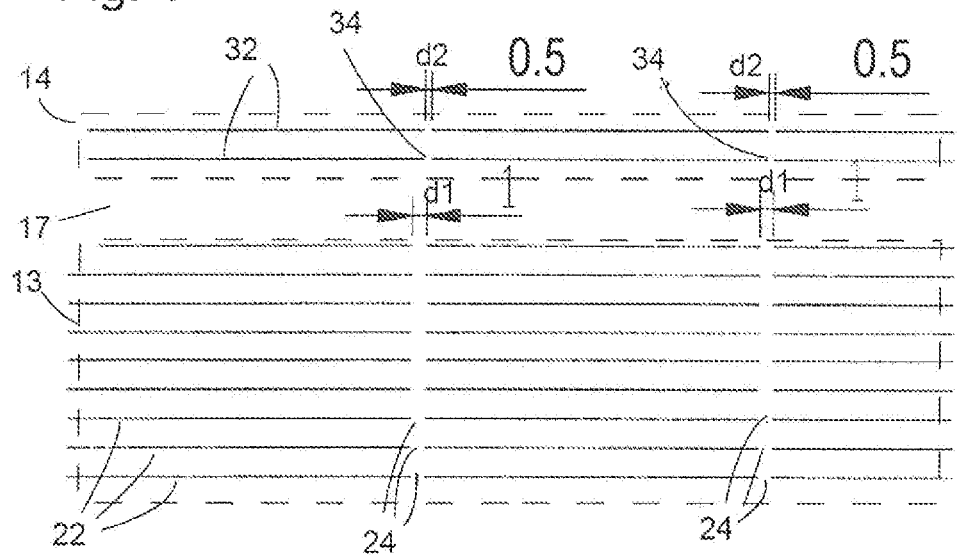
FIG. 4 shows an enlarged top view of the lateral part of the stencil according to the first embodiment of the invention.

Thus, FIGS. 3 and 4 show a first embodiment of a stencil. It comprises a central printing zone 13 comprising first parallel transverse slits 22 intended to form collecting conductors on a photovoltaic cell. These transverse slits 22 are discontinuous, being interrupted by bridges 24 of material in order not to weaken the stencil too much. The central printing zone 13 therefore has an area substantially equal to that of the photovoltaic cell to be printed, and all its apertures 22 are intended to transmit conductive ink.

In addition, the stencil comprises a peripheral deforming zone 14, intended to be located beyond the area to be printed on the photovoltaic cell, between the central printing zone 13 and the lateral cloth 15. It comprises apertures 32 that are similar to the transverse slits 22 for the collecting conductors, being of the same width, lying parallel and being interrupted by bridges 34 of material. These bridges 34 are aligned with the bridges 24 in the central printing zone 13. In this embodiment, these apertures 32 consist of two parallel rectilinear slits each of which comprises four segments, which are separated by three bridges 34 each. However, these bridges 34 have a width d2 smaller than that d1 of the bridges 24 in the central printing zone 13. In this embodiment, d1=0.8 mm and d2=0.5 mm. Thus, the apertures 32 have a structure that is more favourable to deformation than the transverse slits 22 in the central printing zone 13. In addition, as they are located on the parts of the stencil that are subjected by the cloth 15 to the greatest amount of stress, their preferred deformation prevents high stresses from being transmitted to the central printing zone 13 and greatly decreases deformation of the latter.

As a variant, any other geometry promoting peripheral and not central deformation of the stencil may be chosen. For example, the apertures 32 could comprise a smaller number of bridges 34 than the number of bridges 24 between the transverse slits 22.

In addition, the apertures 32 in the peripheral zone 14 are closed by a flexible sealing film in order to prevent the possible passage of ink through this peripheral zone, which is not intended for printing.

It will be noted that the peripheral deforming zone 14 is separated from the central printing zone 13 by a continuous zone 17 that provides the stencil in its entirety with mechanical stability.

Figure 5:
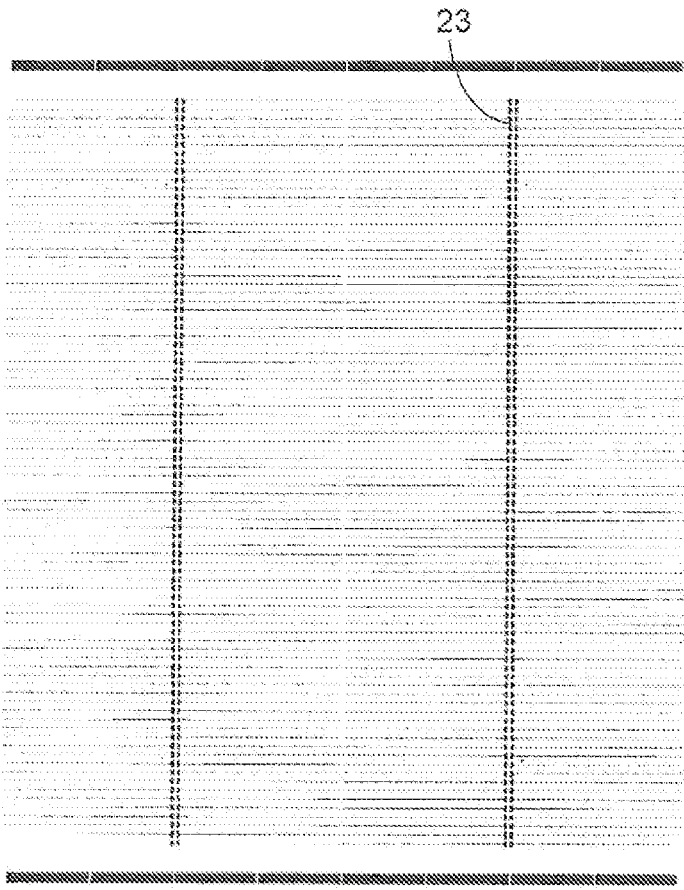
FIG. 5 shows a top view of a stencil according to a second embodiment of the invention.
Figure 6:
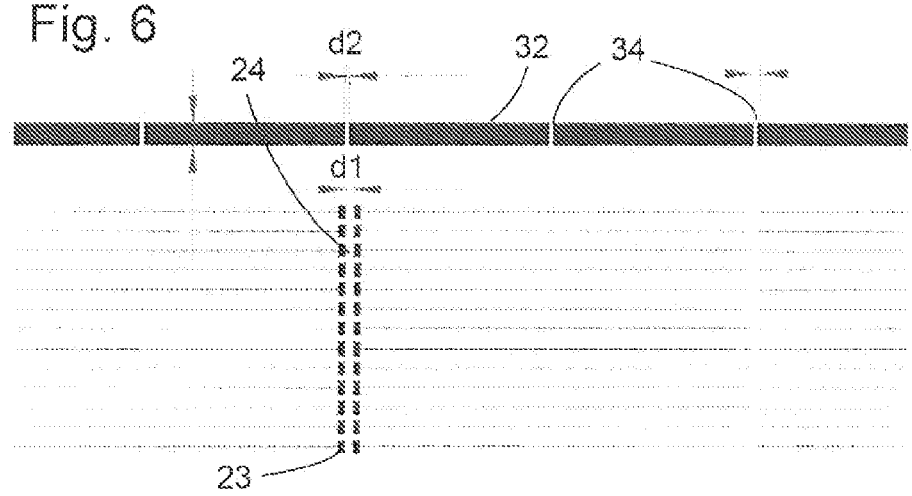
FIG. 6 shows an enlarged view of the lateral part of the stencil according to the second embodiment of the invention.

FIGS. 5 and 6 illustrate a second embodiment that differs from the preceding embodiment in that the apertures 32 in the peripheral deforming zone 14 are much wider, though still separated by bridges 34 of width d2 again smaller than that d1 of the bridges 24 in the central printing zone, which are identical to those in the preceding embodiment. This central printing zone 13 in addition comprises wider discontinuous apertures 23 oriented perpendicularly to the future collecting conductors, which apertures 23 are intended to form the two future "bus bars" of the photovoltaic cell.

Figure 7:
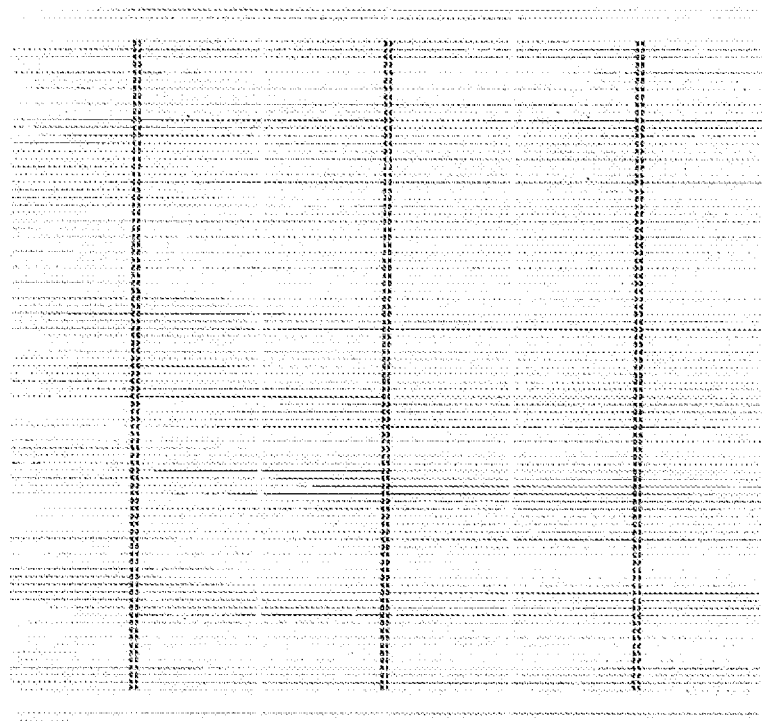
FIG. 7 shows a top view of a stencil according to a third embodiment of the invention.
Figure 8:
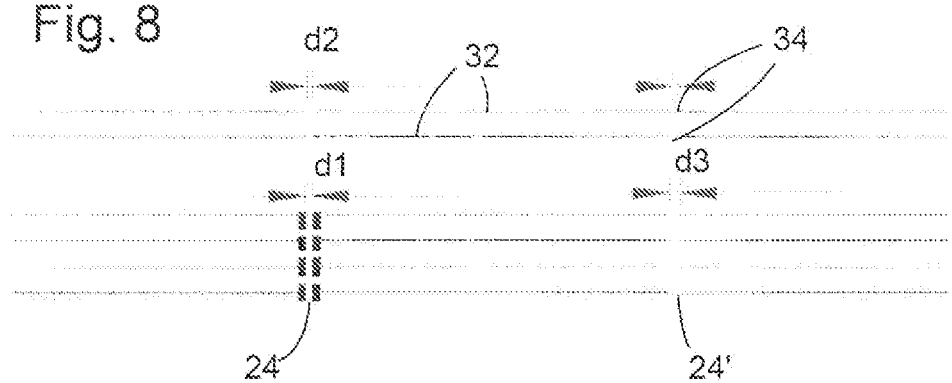
FIG. 8 shows an enlarged view of the lateral part of the stencil according to the third embodiment of the invention.

FIGS. 7 and 8 illustrate a third embodiment of a stencil, differing from the preceding embodiments in that, in the central printing zone 13, the transverse slits 22 for forming the collecting conductors are composed of six segments interrupted by five bridges 24. It will be noted, in this embodiment, that the bridges 24 provided between the apertures 23 for the future bus bars are narrower than the other bridges 24' (d1<d3). In addition, this stencil is intended to produce three bus bars and not two as above. The peripheral deforming zone 14 likewise comprises two apertures 32 parallel to the transverse slits 22, which apertures are interrupted by bridges 34 of smaller width d2 than the bridges 24, 24' in the central printing zone 13 (d2<d1, d2<d3).

Figure 9:
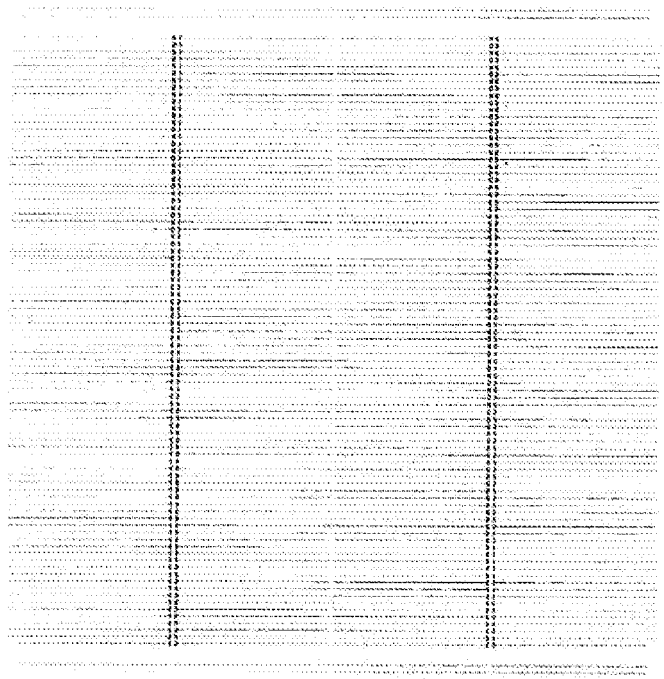
FIG. 9 shows a top view of a stencil according to a fourth embodiment of the invention.
Figure 10:
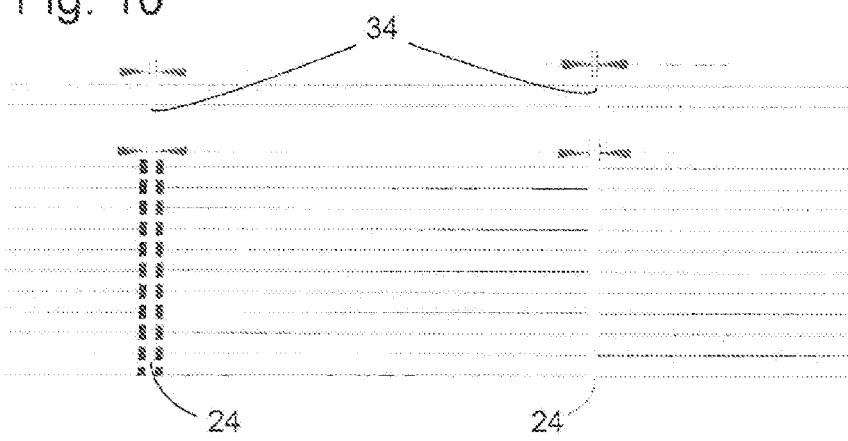
FIG. 10 shows an enlarged view of the lateral part of the stencil according to the fourth embodiment of the invention.

FIGS. 9 and 10 illustrate a fourth embodiment that differs from the first embodiment in that the bridges 24, provided between the apertures 23 for the future bus bars, are narrower than the others 24', as in the preceding embodiment.

Figure 11:
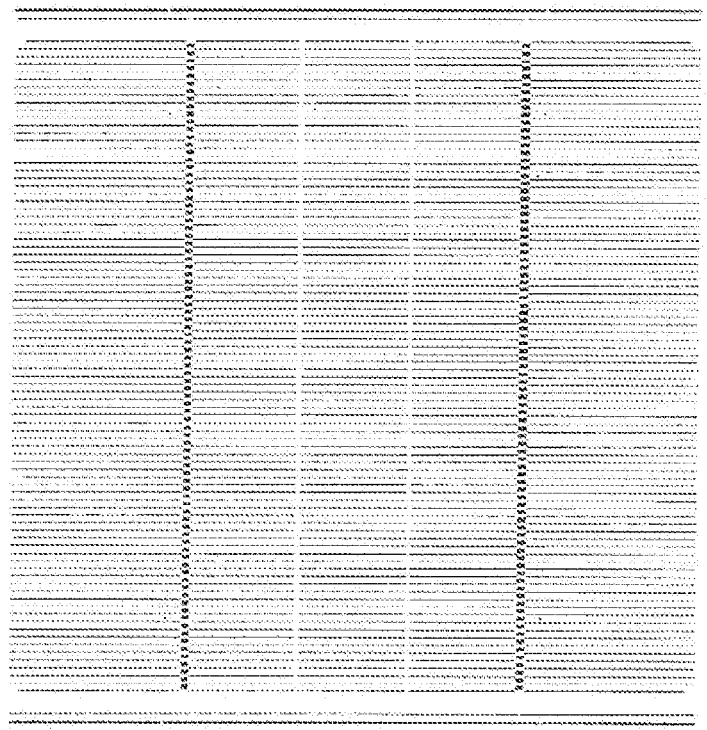
FIG. 11 shows a top view of a stencil according to a fifth embodiment of the invention.
Figure 12:
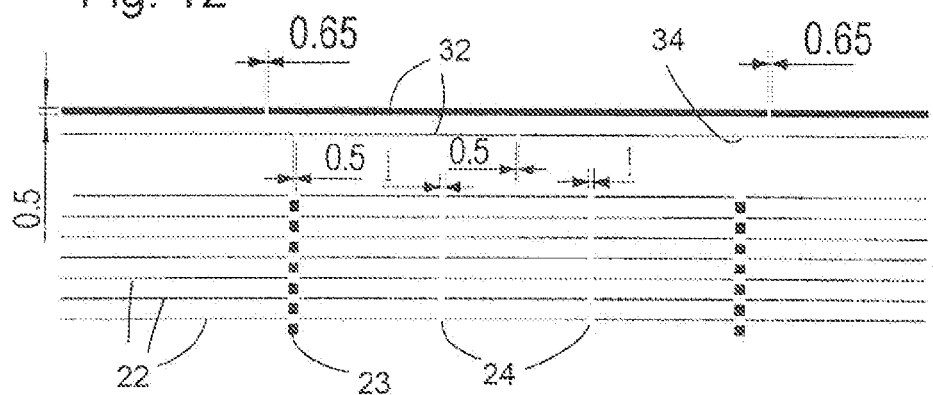
FIG. 12 shows an enlarged view of the lateral part of the stencil according to the fifth embodiment of the invention.

FIGS. 11 and 12 illustrate a fifth embodiment that differs from the preceding embodiments in that the bridges 34 interrupting the apertures 32 located in the peripheral deforming zone 14 are not all aligned with those 24 of the transverse slits 22 in the central printing zone 13. These apertures 32 located in the peripheral deforming zone 14 have different thicknesses. In addition, in this embodiment, the apertures 23 provided for creating the future bus bars have a slightly different shape, oriented in a direction parallel to the slits 22. Lastly, this embodiment may be combined with the embodiment in FIG. 4.

Naturally, it is possible to imagine other embodiments than those illustrated. In particular, the apertures 32 in the peripheral deforming zone 14 may be other sizes and shapes that are not necessarily rectilinear and they need not necessarily be identical in a given stencil. There is at least one aperture 32 on either side of the central printing zone 13. These apertures are preferably symmetrically distributed around the central printing zone 13. The apertures 32 shown are discontinuous, but as a variant they could be continuous, as is illustrated in FIG. 13. In the embodiments described, bridges 34 of material of smaller width are provided in the peripheral deforming zone 14 than those 24 in the central printing zone 13. As a variant, these bridges 34 may have a larger or equal width provided they are smaller in number so that their total width over the entire length of the stencil, the width of all the bridges 34 added together, remains smaller than the total width of the bridges 24 in the central printing zone, obtained by adding all the widths of all these bridges. It would therefore appears to be advantageous for these apertures 32 in the peripheral deforming zone 14 to have an overall area that is larger than the neighbouring apertures provided for the printing, so that they deform more easily than the latter, or in other words, have a lower mechanical stability.

FIG. 13 illustrates a sixth embodiment that differs from the preceding embodiments in that the apertures 32 located in the peripheral deforming zone 14 consist of a continuous rectilinear, slit-shaped aperture that is not interrupted by bridges of material. Such a slit is provided on each side of the central printing zone 13. This central printing zone 13 has the same form as in the preceding embodiment. These apertures 32 in the peripheral deforming zone 14 have a length greater than that of the apertures or slits 22, which extend transversely over substantially the entire length of the central printing zone 13. As a variant, this length is equal to at least a third or even at least half of the length of the central printing zone. In addition, as another variant, a plurality of continuous parallel apertures may be provided on each side of the central printing zone 13. As yet another variant embodiment, this solution may be combined with the embodiments described above.

The stencil thus described is particularly suitable for association with a cloth 15, in a trampoline type construction, as illustrated in FIG. 2. Furthermore, in such a case, the width 1 of the cloth 15, shown in FIG. 2, is preferably greater than or equal to 30 mm in order to obtain sufficient overall elasticity. Measures will advantageously also be taken to keep the stress on this cloth below 25 N, and preferably between 13 and 17 N inclusive. Lastly, it is possible to use thicker stencils with this solution, and especially to achieve a ratio of the thickness of the stencil 12 to the minimum kith of the slits 22, 23 in the central printing zone 13 higher than 1.5, and advantageously about 2.

The solution described is particularly suitable for producing conductors on the surface of a photovoltaic cell. It is particularly suitable for H-shaped conductors, i.e. conductors comprising a plurality of different conductors that are connected together and that extend in substantially perpendicular directions. It is compatible with any type of cell, especially heterojunction (HET) cells on which, metallizations are deposited on a transparent conductive oxide, often in two printing steps, the two printing steps needing to be aligned with each other. It is also compatible with selective emitter cells for which the metallizations must be aligned with preset active zones. The stencil described may be used for any sort of screen printing, and is, in particular, highly compatible with the solution described in document FR 2 943 947.

The invention also relates to a process for producing an electrical conductor on a wafer using a metal stencil such as described above, characterized in that it comprises a step of printing through the stencil in order to deposit a layer of conductive ink on the surface of the wafer, in order to form a number of conductors, a doctor blade being used to press this ink through the apertures in the central part of the stencil, and thereby inducing deformation in its peripheral part.

This printing process is particularly advantageous when employed in a process for manufacturing a photovoltaic device to form all or some of the surface conductors, such as the collecting conductors and/or the bus bar conductors.

In particular, the printing may allow first conductors to be formed in a first direction, these conductors being discontinuous and interrupted in at least one interconnecting zone, before an electrical connection is produced by covering the interconnecting zones of the first conductors with at least one second conductor. This last step is advantageously obtained by fastening a metal strip by soldering or adhesive bonding.

The invention claimed is:

1. Stencil for a screen-printing system, comprising slits (22, 23) in a central printing zone (13), forming a pattern to be printed, which comprises, in a peripheral deforming zone (14), at least one aperture (32) including at least one rectilinear aperture (32) lying parallel to a slit (22) in the central printing zone, which at least one rectilinear aperture (32) is placed in each of the two lateral parts of the stencil, which parts are oriented in the direction of this slit (22) in the central printing zone and positioned on either side of this slit (22) in the central printing zone, the aperture (32) in the peripheral deforming zone (14) having an area leading the peripheral deforming zone (14) to have a greater tendency to deform than the central printing zone (13), and being intended to cause this peripheral deforming zone (14) to deform under the effect of a stress applied to the stencil while reducing deformation of the central printing zone (13).

2. Stencil according to claim 1, wherein it comprises a plurality of transverse slits (22) in the central printing zone (13), these slits (22) being parallel, discontinuous, interrupted by bridges (24) of material, and intended to form collecting conductors on a photovoltaic cell.

3. Stencil according to claim 2, wherein the apertures (32) in the peripheral deforming zone (14) lie parallel to the transverse slits (22).

4. Stencil according to claim 1, wherein it comprises at least one aperture (32) that Is continuous over its entire length in the peripheral deforming zone (14), which aperture has a length larger than or equal to a third of the length of the central printing zone (13), or larger than or equal to half this length, or larger than or equal to this length.

5. Stencil according to claim 1, wherein it comprises at least two apertures (32) that are continuous over their entire length, these apertures (32) being placed, respectively, on two opposite sides around the central printing zone (13) in the peripheral deforming zone (14).

6. Stencil according to claim 1, wherein the apertures (32) in the peripheral deforming zone (14) comprise at least one discontinuous rectilinear aperture interrupted by bridges (34) of material.

7. Stencil according to claim 6, wherein the central printing zone (13) comprises rectilinear slits (22) interrupted by bridges (24) of material, and in that the bridges (34) of material of an aperture (32) in the peripheral deforming zone (14) have a total width smaller than the total width of all the bridges (23) of a slit (22) in the central printing zone (13).

8. Stencil according to claim 7, wherein the apertures (32) in the peripheral deforming zone (14) lie parallel to the slits (22) in the central printing zone (13), in that an aperture (32) in the peripheral deforming zone (14) comprises the same number of bridges (34) as these slits (22) in the central printing zone (13), in that these bridges (34) are aligned with those (24) of these slits (22) in the central printing zone (13), and in that the width of the bridges (34) in the peripheral deforming zone (14) is smaller than that of the bridges (24) of the slits (22) in the central printing zone (13).

9. Stencil according to claim 7, wherein the apertures (32) in the peripheral deforming zone (14) lie parallel to the slits (22) in the central printing zone (13), and in that one aperture (32) in the peripheral deforming zone (14) comprises fewer bridges (34) than a slit (22) in the central printing zone (13).

10. Stencil according to claim 1, wherein the ratio of the thickness of the stencil to the minimum width of the slits (22) in the central printing zone (13) is greater than 1.5.

11. Stencil according to claim 1, wherein it is made of metal.

12. Stencil according to claim 1, wherein the apertures (32) in the peripheral deforming zone (14) are closed by an elastic sealing element in order to prevent ink from passing through these apertures (32).

13. Screen-printing system, which comprises a stencil (12) according to claim 1.

14. Screen-printing system according to claim 13, wherein it comprises a stencil (12) fastened to a cloth (15) in order to form a trampoline assembly.

15. Screen-printing system according to claim 14, wherein the cloth (15) has a width larger than 30 mm.

16. Screen-printing system according to claim 13, wherein it is part of a unit for printing conductors onto a photovoltaic device.

17. Unit for manufacturing photovoltaic devices, which comprises a screen-printing system according to claim 13.

18. Screen-printing process using a stencil according to claim 1, wherein it comprises a step of doctoring the stencil inducing a deformation in the peripheral deforming zone (14) greater than its deformation in the central printing zone (13).

19. Process for manufacturing a photovoltaic device, which comprises a step of screen printing conductors onto a silicon wafer using a stencil according to claim 1.

* * * * *